(12) United States Patent
Sakaida et al.

(10) Patent No.: US 7,296,340 B2
(45) Date of Patent: Nov. 20, 2007

(54) APPARATUS OF RECYCLING PRINTED CIRCUIT BOARD

(75) Inventors: Atsusi Sakaida, Nagoya (JP); Toshihisa Taniguchi, Handa (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/185,760

(22) Filed: Jul. 21, 2005

(65) Prior Publication Data

US 2005/0246879 A1    Nov. 10, 2005

Related U.S. Application Data

(62) Division of application No. 10/381,054, filed as application No. PCT/JP02/013152 on Dec. 16, 2002, now Pat. No. 7,107,661.

(30) Foreign Application Priority Data

Dec. 18, 2001  (JP) ............... 2001-385117
Dec. 21, 2001  (JP) ............... 2001-389688

(51) Int. Cl.
    B23P 19/00       (2006.01)
    B23P 19/04       (2006.01)
(52) U.S. Cl. .............. 29/700; 29/403.1; 29/403.3; 29/403.4; 29/762; 241/24.11; 241/24.15; 241/24.21
(58) Field of Classification Search .......... 29/403.4, 29/403.3, 403.1, 700, 762; 241/24.15, 24.21, 241/24.11
See application file for complete search history.

(56) References Cited

U.S. PATENT DOCUMENTS 5,836,524 A * 11/1998 Wang ................ 241/23
6,089,479 A * 7/2000 Chang et al. ........... 241/17

FOREIGN PATENT DOCUMENTS

| CN | 1238244    | 12/1999 |
|----|------------|---------|
| JP | A-S51-11090 | 1/1976  |
| JP | A-H06-164086 | 6/1994 |
| JP | A-H07-326834 | 12/1995 |
| JP | A-H9-324222 | 12/1997 |
| JP | A-H10-173303 | 6/1998 |
| JP | A-H11-36020 | 2/1999 |
| JP | A-2002-177922 | 6/2002 |
| JP | A-2002-233856 | 8/2002 |

OTHER PUBLICATIONS

Notice of Preliminary Rejection dated Jan. 31, 2005 in corresponding Korean application No. 10-2003-7007495.

* cited by examiner

Primary Examiner—Jermie E. Cozart
(74) Attorney, Agent, or Firm—Posz Law Group, PLC

(57) ABSTRACT

The present invention provides a recycler that recycles a printed circuit board for separating and retrieving a metallic material, which includes a printed metallic material, and an insulating material, both composing the printed circuit board. The insulating body base of the printed circuit board as the waste printed circuit board can be a thermoplastic resin or a mixture of thermoplastic resin and inorganic loading material. The recycler includes a pressuring device that pressurizes the waste printed circuit board, a heater that heats the waste printed circuit board to a predetermined temperature at which the waste printed circuit board is at least softened, and a filter that filters the resin material from the waste printed circuit board. The heater can be maintain the filter at the predetermined temperature provided by the heater.

2 Claims, 6 Drawing Sheets

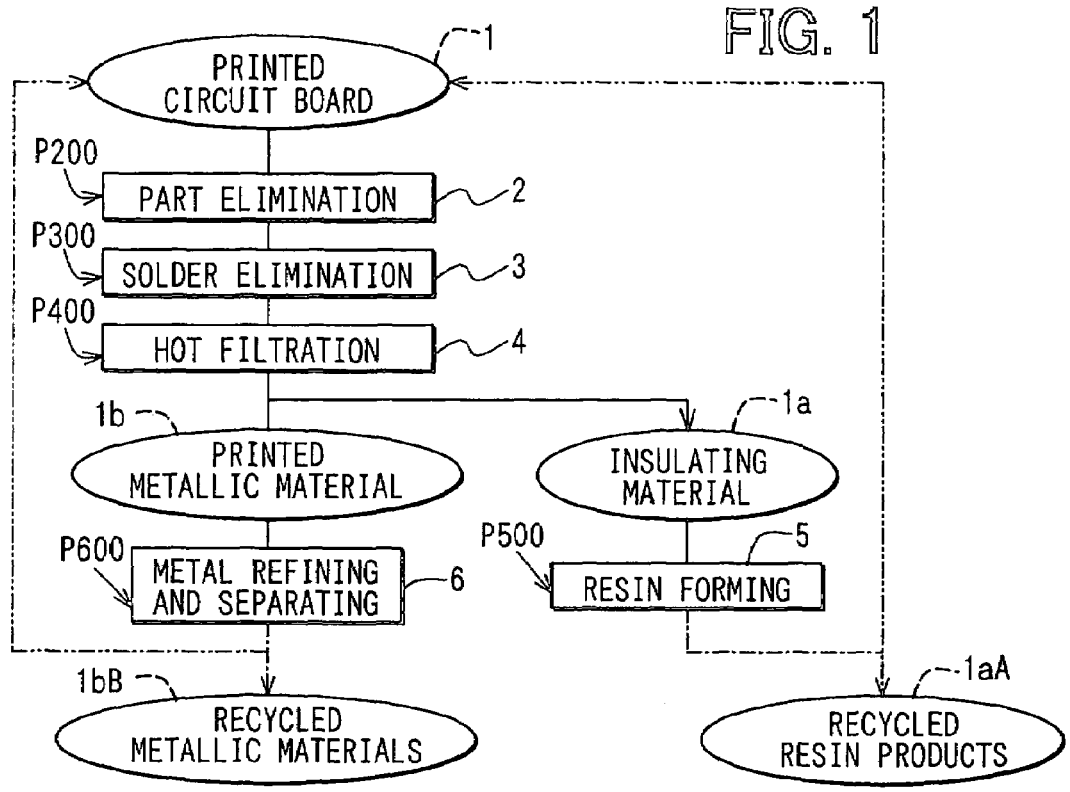
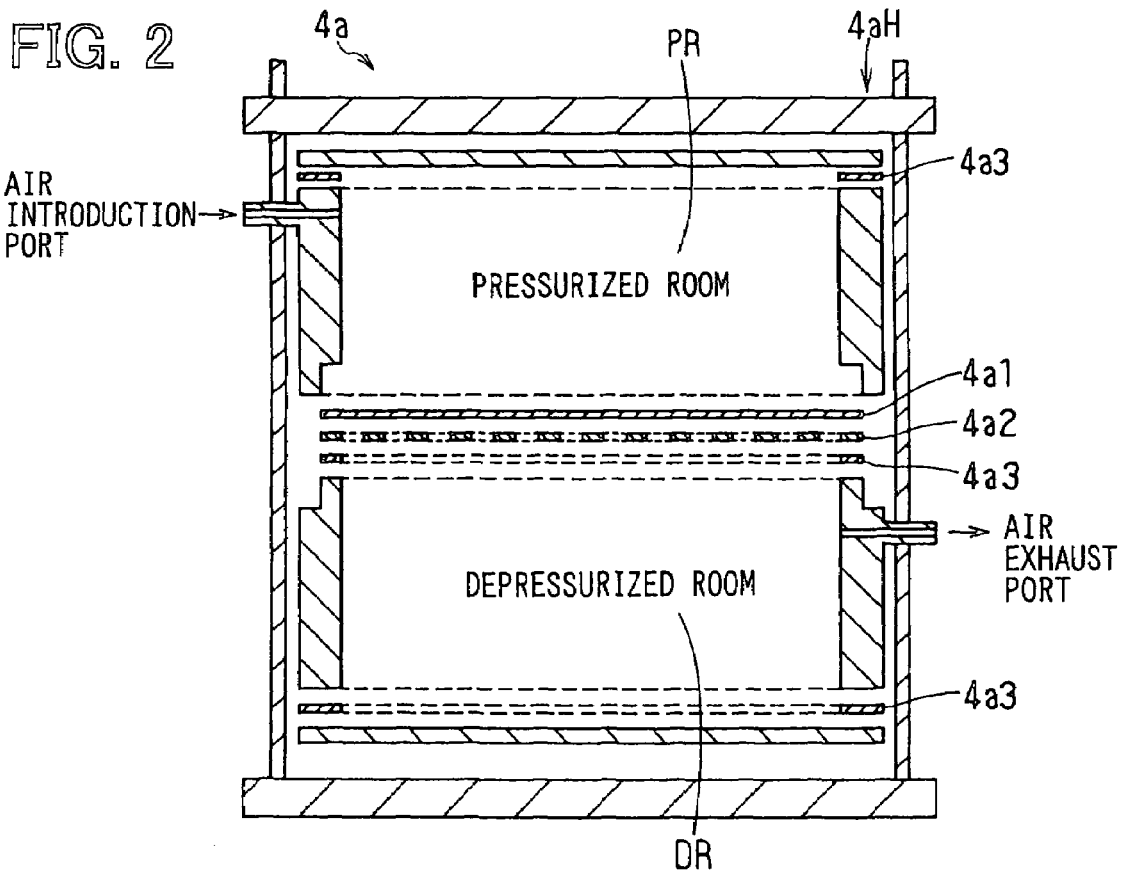

APPARATUS OF RECYCLING PRINTED CIRCUIT BOARD

This application is a divisional application of U.S. patent application Ser. No. 10/381,054, filed on Mar. 26, 2003, now U.S. Pat. No. 7,107,661, which is based on and incorporates herein by reference PCT International Application No. PCT/JP02/013152 filed on Dec. 16, 2002.

FIELD OF THE INVENTION

The present invention relates to a method and apparatus for recycling a printed circuit board. More particularly, the present invention relates to a method and apparatus for recycling also an insulating material, which composes a printed circuit board.

BACKGROUND OF THE INVENTION

Conventionally, a printed circuit board, which is mainly utilized in electric equipment, has been made of fiberglass and epoxy resin, which is a sort of thermosetting resin. A method for recycling the printed circuit board according to a prior art has been available only for retrieving and recycling printed metallic material composing a printed circuit wiring. Therefore, after separating and retrieving the printed metallic material, residual insulating material and so on are only available for thermal energy by incinerating them, or bury in the ground as a waste.

In the above prior art, the printed metallic material is retrieved. However, the insulating material such as thermoplastic resin and the like composing a board material are not retrieved as reusable material, and this residual insulating material causes an increase of the waste. Therefore, this is an important requirement to reduce emission of the waste and carbon dioxide for the preservation of the environment on the earth. Also it is an important requirement to utilize the resources on the earth efficiently. In the present state of affairs, not only a manufacturer of a printed circuit board but also a manufacturer of electric equipment, which utilizes a printed circuit board, has a long-pending requirement to establish a method for recycling a printed circuit board so as to retrieve and to recycle both the printed metallic material and the insulating material.

Considering the above requirements, the object of the present invention is to provide a method and apparatus of recycling a printed circuit board so that both a printed metallic material and an insulating material composing a printed circuit board are separated and retrieved, and that those retrieved materials are available for recycling.

DISCLOSURE OF THE INVENTION

To accomplish the above first object, the present invention provides a method of recycling a printed circuit board so that both metallic material and insulating material are separated and retrieved from a waste printed circuit board, which is disposed in waste electric equipment or which is a waste produced in a process of manufacturing electric equipment. The printed circuit board is composed of the insulating material and the metallic material, which involves the printed metallic material. At first, the printed circuit board is heated. Then, only the insulating material passes through a filter by force-filtration of the heated printed circuit board. By this heating and force-filtering of the filter and the like, the insulating material is separated and retrieved from mixture of insulating material and metallic material composing the printed circuit board. For example, it is easy to separate and to retrieve from the mixture of insulating material and metallic material using the filter, the mesh size of which is sufficiently large so that the filter passes only the insulating material and does not pass the printed metallic material.

At least either the insulating material or the metallic material, which is separated and retrieved in the above way, is available for recycling. When the amounts of the retrieved insulating material and the retrieved metallic material are sufficiently large for recycling respectively, both of them are available for recycling.

The force-filtration means a filtration with heating and pressurizing the printed circuit board. This force-filtration promotes the efficiency of the filtration by the filter or the like.

The printed circuit board, which is separated and retrieved into the insulating material and the metallic material, is composed of an insulating body base and a conductive printed circuit. The insulating body base is made of either thermoplastic resin or mixture of thermoplastic resin and inorganic loading material. The conductive printed circuit is made of printed metallic material, which is disposed on the insulating body base. The conductive printed circuit is formed on the insulating body base, which is called an insulating body base printed with conductive circuit. After that, the insulating body bases printed with conductive circuit are stacked together, adhered together by heating and pressurizing, and formed into a multi-layer printed circuit board. When the resin material composing the insulating material in the printed circuit board is thermoplastic resin or mixture of thermoplastic resin and inorganic loading material, not only the printed metallic material but also the insulating material is surely recycled. Therefore, after separating and retrieving, the retrieved insulating material is also formed into a predetermined shape by heating. Moreover, when even the stacked multi-layer printed circuit board is heated in separating and retrieving process up to a predetermined temperature, which is nearly the process temperature for forming the stacked multi-layer printed circuit board in the above stacking process, the stacked multi-layer printed circuit board is sufficiently softened so as to deform plastically. Then, only the insulating material passes by means of the above force-filtration.

The characteristic of the insulating material around at the temperature for forming the stacked multi-layer printed circuit board in the above stacking process is as follows. It is preferred that elastic modulus of thermoplastic resin is in the range of 1 MPa to 1000 MPa at a predetermined heating temperature in heating and pressurizing. Therefore, in the separating and retrieving process, when the stacked multi-layer printed circuit board is heated up to nearly the process temperature for forming the stacked multi-layer printed circuit board in the stacking process, the elastic modulus of thermoplastic resin is sufficiently reduced so that it is easy to perform the separating and retrieving operation such as filtering and the like.

When the printed circuit board has the following character, it is preferred that a conductive product in the printed circuit board is made of metallic material only, or mixture of metallic material and either thermoplastic resin composing the insulating body base or mixture of thermoplastic resin and inorganic loading material comprising the insulating body base. The character of the printed circuit board is that the insulating body base in the printed circuit board is a resin film, which is made of either thermoplastic resin or mixture of thermoplastic resin and inorganic loading material, and that conductive printed circuits formed on the printed circuit board are electrically connected together by the conductive product integrally formed in a via-hole, which is formed in the insulating body base. The retrieved insulating material may entrap a contamination of the conductive product, which composes an interlayer bonding material, during the separating and retrieving the insulating material from the printed circuit board. The retrieved insulating material is not reduced in its purity, and is expected to have the equivalent characteristics to the before-retrieving insulating material, because the composition of the contamination is the same as that of the insulating material composing the insulating body base.

An apparatus of recycling the printed circuit board performs to separate the insulating material and the metallic material by passing the insulating material only in the above heating and filtering process. This apparatus is composed of a pressurizing means for pressurizing the printed circuit board, a heating means for heating the printed circuit board up to a predetermined temperature, at which at least the printed circuit board is softened, and a filtering means for filtering the insulating material, which composes the insulating body base, from the printed circuit board maintained at the predetermined temperature by the heating means. The heating means for heating the printed circuit board can soften the thermoplastic material composing the printed circuit board, when the printed circuit board is recycled as a waste printed circuit board, in which the resin material is thermoplastic resin. Moreover, the pressurizing means provides the force-filtration to pass the thermoplastic resin only, and the filtering means provides for separating and retrieving easily. For example, the heating means maintains the temperature, which is near the process temperature for forming the printed circuit board by hot forming in primary product process. Then, the resin material, which is melted, is separated and retrieved easily by the filtering means.

The pressurizing means includes a driving shaft, a driving unit, and a holder unit. The driving shaft has a rotational body to transport the printed circuit board. The driving unit rotates the driving shaft. The holder unit accommodates the rotational body. The pressurizing means generates a predetermined pressure caused by rotating force of the rotational body, and applies the pressure on an inner circumference wall of the holder unit, which accommodates the rotational body. The above pressurizing means is an example of the means for plastically deforming the thermoplastic resin, which is heated up to the predetermined temperature and softened, so as to force-filter the thermoplastic resin composing the printed circuit board. This pressurizing means transports the printed circuit board by the rotational body and pressurizes the printed circuit board by the transport pressure by rotating the rotational body.

The rotational body to pressurize the printed circuit board in above way has a helical rotational body. The driving unit rotates the rotational body in the helical direction. It is preferred that the filtering means is disposed on an inner circumference wall of the holder unit and is disposed on the side of a top end of the rotational body. This top end is driven in the helical direction of the rotational body. The rotational force, which rotates the helical rotational body in the helical direction, generates a centrifugal force and a feeding force, i.e., pressurizing force by transport pressure. The centrifugal force is a radial component force along with a helical rotational direction, and the feeding force is an axial component force along with an axial direction. Therefore, the more the printed circuit board feeds to the top end, which is driven in the helical direction of the rotational body, the more the printed circuit board is pressurized. Moreover, when the filter in the filtering means is disposed and exposed on the inner circumference wall of the holder unit, the filtering performance prevents from reducing because the feeding force along with the axial direction eliminates the metallic material accumulated in the filtering means. Accordingly, it is easy to filter the resin material by the filtering means, and the resin material is filtered efficiently.

The filtering means has the filter to pass the resin material only from the waste printed circuit board. It is preferred that the filter is disposed and exposed on the inner circumference wall of the holder unit. Then, the resin material is retrieved in the radial outward direction of the driving shaft. Therefore, the filter has an ability that only the resin material is easily passed through the filter from the pressurized printed circuit board because the filter is disposed and exposed on the inner circumference wall of the holder unit, of which the inner circumference wall is applied the pressurizing force by the above rotational force.

It is preferred that the filter is made of sintered metal. This filter may be formed to have a mesh hole, which filters the filtering object and is a meandering mesh hole, not a straight through hole. Accordingly, the filter has meandering mesh holes that pass the resin material, and the metallic material is prevented to pass through the filter because even long and thin needle-like metallic material can be caught by the meandering mesh hole.

Considering a relationship between the pressurizing means and the filtering means for passing the resin material only by the force-filtration, it is preferred that the driving shaft of the rotational body is disposed in the vertical direction. When the filter passes the resin material only from the mixture of the resin material and the metallic material, the metallic material, which is not passed through the filtering means, precipitates vertically downward. Moreover, the resin material is pressed to the inner circumference wall by pressurizing force by the above rotational force.

A reservoir means reserves the separated metallic material by the filtering means, which separates and retrieves the metallic material and the resin material. It is preferred that a space, which is provided by the reservoir means and reserves the metallic material, is disposed on one end of the inner circumference wall of the holder unit, which is opposite to the driving unit. In other words, the end of the inner circumference wall of the holder unit, which is opposite to the driving unit and composes the pressurizing means, has the space to reserve the metallic material. Accordingly, the metallic material deposits and fills the space in accordance with separating and retrieving the resin material by the filtering means from the mixture of the metallic material and the resin material, which compose the printed circuit board transported by the rotational body.

The heating means is disposed on the inner circumference wall of the holder unit, and has a heater for heating the waste printed circuit board. An aggregation is occurred by rotation of the rotational body, and the aggregation generates a frictional heat by collision of the printed circuit boards together. This frictional heat assists the heater for heating the printed circuit board, and an energy consumption of the heater is reduced.

BRIEF DESCRIPTION OF THE DRAWINGS

FIG. 1 is a schematic block diagram showing a method of recycling a printed circuit board according to the first embodiment of the present invention.

FIG. 2 is a schematic cross-sectional view showing hot filtration equipment used in hot filtration process according to the first embodiment of the present invention.

FIG. 7 are schematic partially enlarged views showing states of material in a via-hole of a printed circuit board applied to a method of recycling according to the third embodiment of the present invention, wherein

BEST MODE FOR CARRYING OUT THE INVENTION

Examples (i.e., embodiments) for carrying out a method and apparatus of recycling a printed circuit board according to the present invention are described as follows.

FIRST EMBODIMENT

Figure 5:
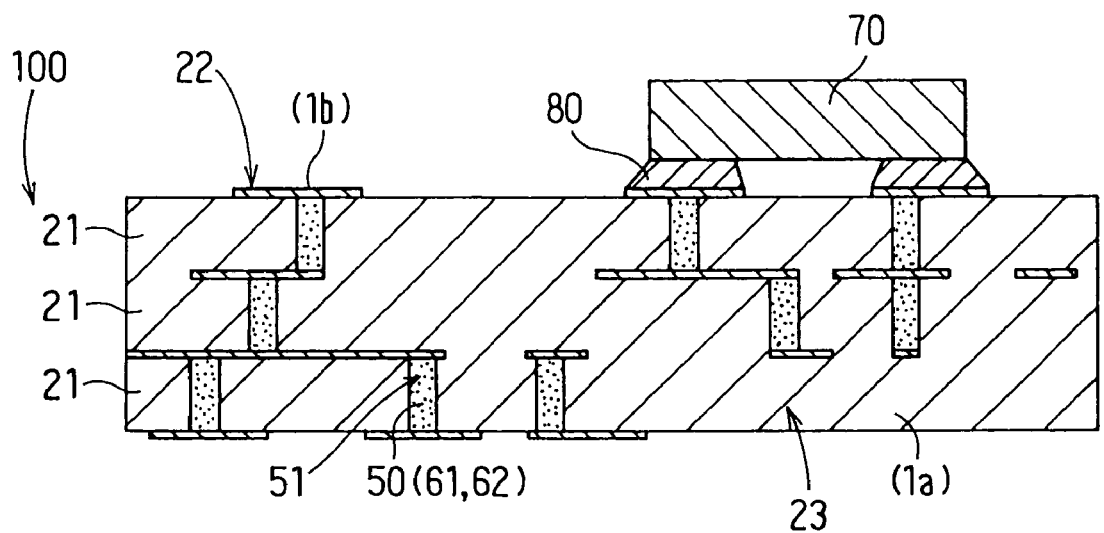
FIG. 5 is a schematic cross-sectional view showing the printed circuit board applied to the method of recycling according to the first embodiment of the present invention.
Figure 6:
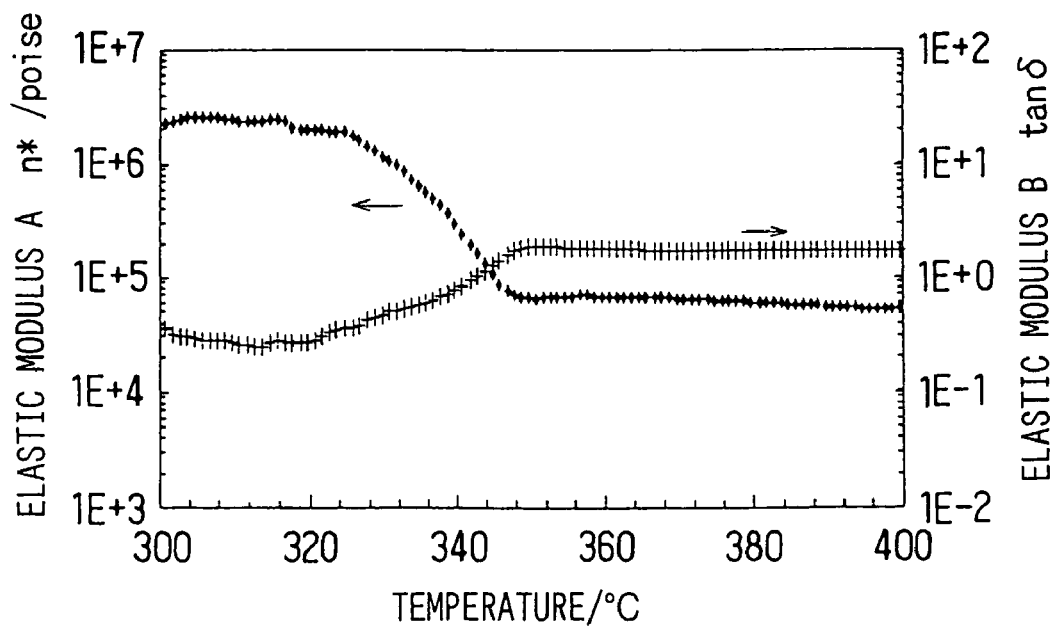
FIG. 6 is a graph showing a relation between a temperature and an elastic modulus of an insulating material shown in FIG. 5.

FIG. 1 is a schematic block diagram showing an overall process of a method of recycling a printed circuit board according to the first embodiment of the present invention. FIG. 2 is a schematic cross-sectional view showing hot filtration equipment used in a hot filtration process shown in FIG. 1. FIG. 5 is a schematic cross-sectional view showing the printed circuit board applied to the method of recycling shown in FIG. 1. FIG. 6 is a graph showing a relation between a temperature and an elastic modulus of an insulating material composing an insulating body base shown in FIG. 5. FIG. 2 is the schematic cross-sectional view showing the hot filtration equipment used in the hot filtration process shown in FIG. 1. Besides, FIG. 1 is also a schematic block diagram showing a recycling system to perform the method of recycling the printed circuit board according to the first embodiment of the present invention.

As shown in FIG. 1, the overall system for the method of recycling the printed circuit board is composed of a waste printed circuit board 1 as a work piece 1, a part elimination means 2 for eliminating mounted parts so as to primary-process the work piece 1, a solder elimination means 3 for eliminating solder so as to secondary-process the work piece 1, a hot filtration means 4 for performing after the primary and secondary processes, a resin-forming means 5 for resin-forming an insulating material, which is separated and retrieved by the hot filtration means 4, and a metal refining and separating means 6 for refining a printed metallic material, which is separated and retrieved by the hot filtration means 4.

The waste printed circuit board 1 is a printed circuit board 100 used in waste electric equipment or a so-called waste printed circuit board as a waste produced in a process of manufacturing electric equipment. As shown in FIG. 5, the waste printed circuit board 1 includes circuit boards 21, which are composed of insulating body bases 23 and conductive printed circuits 22, a mounted part 70, which is mounted on the circuit board 21, and solder 80, which connect the mounted part 70 and the circuit board 21.

When the circuit boards 21 such as conductive printed circuit film or the like (i.e., conductive printed circuit film 21) are stacked into a multi-layer circuit board, the multi-layer circuit board has a conductive product 51. The conductive product 51 is made of interlayer binding material to connect the conductive printed circuits 22 together, i.e., to connect layers electrically together. Then, the multi-layer circuit board of the conductive printed circuit films 21 composes an insulating body base printed with conductive circuit.

The printed circuit board 100, which is recycled as the waste printed circuit board 1 according to the first embodiment, has properties of a work piece as follows.

At first, the insulating body base 23 is made of insulating material, which may be any kind of insulating material such as a resin film as long as the insulating material is either thermoplastic resin only or mixture of thermoplastic resin and inorganic loading material.

However, when solder is used for mounting the mounted part 70 such as semiconductor device and the like on the printed circuit board 100, the insulating material composing the insulating body base 23 is limited to a material that is possible to heat more than 250 degrees Celsius among the above thermoplastic resin only or the above mixture of thermoplastic resin and inorganic loading material. For example, those materials are polyether ether ketone (i.e., PEEK) resin, polyether imide (i.e., PEI) resin, mixture of PEEK resin and PEI resin, thermoplastic polyimide (i.e., thermoplastic PI) resin, polyphenylene sulfide (i.e., PPS) resin, and liquid crystal polymer (i.e., LCP).

The inorganic loading material is an additive for the purpose of adjusting physical properties of the printed circuit board 100. For example, silica (i.e., $SiO_2$) powder is added in the printed circuit board 100 to decrease a coefficient of thermal expansion, aluminum nitride (i.e., AlN) powder is added to increase a coefficient of thermal conductivity, fiber glass is added to increase a mechanical strength, and so on. These additives are added in accordance with their purpose.

The insulating body base 23 in the first embodiment is made of the insulating material composed of a resin film 23. The resin film 23 is made of mixture of PEEK resin and PEI resin, and mica (i.e., $KMg_3(SiAl_3O_{10})F_4$, etc) is added in the mixture of PEEK resin and PEI resin as an inorganic loading material. The weight ratio of the PEEK resin to the PEI resin is 38:62, and the weight ratio of the mixture of the PEEK resin and the PEI resin to the mica is 100:15.5.

The printed metallic material may be any kind of metallic material such as copper (Cu), aluminum (Al), nickel (Ni), silver (Ag), copper alloy, silver alloy, or the like. The printed metallic material in the first embodiment is copper foil. For example, after the copper foil is press-contacted and adhered to the above resin film 23, the conductive printed circuit 22 is formed by eliminating unwanted part from the copper foil, e.g., etching or the like.

The conductive printed circuit film 21 is constructed by forming the conductive printed circuit 22 on the surface of the resin film 23. After that, a hole as a via-hole 24 for interlayer bonding is formed by laser beam drilling in the resin film 23, and so on. Then, a conductive bonding paste 50 as an interlayer bonding material is filled into the via-hole 24, and is formed into the conductive product 51 to connect the conductive printed circuits 22 electrically. This electric connection is not only in a so-called electrical contact continuity but also in an electrical connection by solid phase diffusion between metals according to the third embodiment described later, and so on.

Next, the elimination means 2 for eliminating the mounted part shown in FIG. 1 (i.e., part elimination means 2) is for eliminating the mounted part 70 such as a semiconductor device and so on. This part elimination means 2 is performed by well-known method. For example, it may be a mechanical elimination means for removing the mounted part 70 mechanically at room temperature, a hot elimination means for removing the mounted part 70 by heating up to the melting temperature of solder in the printed circuit board 100, and so on.

When the printed circuit board 100 is assembled in the electric equipment, it is necessary to remove the assembled printed circuit board 100 from the electric equipment. This removing method is performed by any kind of removing method such as destroying the electric equipment, disassembling a connector for joining the printed circuit board 100 to the electric equipment, or the like. In the first embodiment, the waste printed circuit board 1 is removed from the electric equipment by disassembling the connector for joining the printed circuit board 100 to the electric equipment.

The solder elimination means 3 is for eliminating a solder 80. The solder 80 is a residual solder, which is in the waste printed circuit board 1 after removing the mounted part 70 by the mechanical elimination means as the part elimination means 2, a melted solder, which is melted by the hot elimination means, or a re-solidified solder, which is re-solidified by cooling after the hot elimination means. This solder elimination means 3 is performed by well-known method, for example, a mechanical solder elimination means for removing the solder mechanically using a grinder and the like, a chemical solder eliminating means for dissolving the solder chemically using a mixture of hydrochloric acid and sulfuric acid and the like, and so on.

The hot filtration means 4 heats and force-filters the waste printed circuit board 1, after the mounted part 70 such as a semiconductor device and the solder 80 are eliminated from the waste printed circuit board 1 by the part elimination means 2 and the solder elimination means 3 respectively. This hot filtration means 4 is capable of separating and retrieving an insulating material 1a and a printed metallic material 1b by filtering only the insulating material 1a from the mixture of the insulating material 1a and the printed metallic material 1b, which are components of the printed circuit board 100. The details of the means and the procedure to filter only the insulating material 1a by heating and force-filtering the printed circuit board 100 as the work piece 1 is described later.

The insulating material 1a, which is separated and retrieved from the waste printed circuit board 1, is formed into recycled material products by the resin-forming means 5. This resin-forming means 5 is performed by well-known method for forming into the recycled resin products 1aA. The printed metallic material 1b, which is also separated and retrieved from the waste printed circuit board 1, is formed into recycled material products by the metal refining and separating means 6. This metal refining and separating means 6 is performed by well-known method for refining and separating in each metallic category.

As shown in FIG. 2, the hot filtration means 4 to filter the insulating material 1a only by heating and force-filtering the printed circuit board 100 as the work piece 1 is performed by hot filtration equipment 4a. The hot filtration equipment 4a is composed of a filter 4a1, a punching metal 4a2, a pressurized room PR, a depressurized room DP, and a casing 4aH. The pressurized room PR and the depressurized room DP are divided by the filter 4a1 and so on, and are accommodated in the casing 4aH. The casing 4aH accommodates the pressurized room PR and the depressurized room DP, and has a hermetically sealed construction by screwing a sealing material 4a3 together.

The work piece 1 is placed on the bottom of the pressurized room PR, and is heated up to the melting temperature by a heater and the like (not shown). The work piece 1 is also pressurized by air introduced from an air introduction port, which is disposed upside of the pressurized room PR. The filter 4a1, which is disposed over the punching metal 4a2, is disposed under the pressurized room PR. A mesh size of the filter 4a1 is selected so as to pass the insulating material 1a therethrough and not to pass the printed metallic material 1b therethrough.

The depressurized room DR is disposed under the filter 4a1, and is depressurized by force-exhausting air by a pump (not shown) from an air exhaust port, which is disposed upside of the depressurized room DR. The force-filtration is performed by the differential pressure between the pressurized room PR and the depressurized room DP, because the work piece 1, which is placed in the pressurized room PR, especially the insulating material 1a, which is passing through the filter 4a1, is pressurized by the differential pressure. The insulating material 1a is extruded into the depressurized room DR through the filter 4a1, and is retrieved from the downside of the casing 4aH in FIG. 2. For example, the work piece 1 is heated up to 400 degrees Celsius, and is pressurized to 10 MPa in the pressurized room PR. Then, only the insulating material 1a in the work piece 1 is passed through the filter 4a1, which is composed of a minimum sized mesh (in detail, e.g., item #50 mesh) made of stainless. The printed metallic material, which is not passed through the filter 4a1, remains on the filter 4a1. Then, the hot filtration equipment 4a is separated by its center so as to retrieve the printed metallic material.

In the first embodiment, the hot filtration equipment 4a is described as the equipment for filtering the insulating material 1a as the work piece 1 through the filter 4a1 by the differential pressure applied to the work piece 1. The hot filtration equipment 4a may be equipment that applies the insulating material 1a mechanically and force-filter the insulating material 1a through the filter 4a1. Moreover, the hot filtration equipment 4a may be any kind of equipment that heats and pressurizes the insulating material 1a, and passes through the filter 4a1.

The printed circuit board 100 is heated and force-filtered as the work piece 1. Both a waste printed circuit board 1 that has an initial shape as it is and a waste printed circuit board 1 that is preliminary processed into easy-to-process shape by cutting may be used as the work piece 1.

In the first embodiment, the insulating body base 23 of the waste printed circuit board 1 is made of the mixture of thermoplastic resin and inorganic loading material. The above resin material passes easily through the mesh even at a comparably low pressure such as 10 MPa, because the elastic modulus of the insulating material 1a is sufficiently reduced at temperatures of 360 degrees Celsius or higher, according to a relation between a temperature and an elastic modulus of the insulating material shown in FIG. 6.

On the other hand, the copper (Cu) foil composing the printed metallic material 1b (i.e., in detail, the copper foil composing the conductive printed circuit 22) and the conductive product 51 made of the interlayer bonding material are in the solid state, in other words, in the solid phase, because elastic modulus of these materials is high around at 400 degrees Celsius and is different from that of the insulating material.

Therefore, the printed metallic material 1b and the conductive product 51 are not passed through the filter 4a1 unless these materials are heated up to the melting point and are melted. As a result, the insulating material 1a is separated and retrieved.

Referring to FIG. 1, the process of recycling the printed circuit board according to the first embodiment of the present invention is described as follows. The recycling method according to the first embodiment is composed of separating and retrieving materials so as to be classified into material categories, and recycling the separated and retrieved materials. As shown in FIG. 1, the process of recycling is composed of part elimination process P200, solder elimination process P300, hot filtration process P400, resin forming process P500, and metal refining and separating process P600. In the resin forming process P500, the insulating material 1a, which is separated and retrieved in the hot filtration process P400, is processed so as to utilize as resin products. In the metal refining and separating process P600, the printed metallic material 1b, which is separated and retrieved in the hot filtration process P400, is processed so as to utilize as metallic materials.

Besides, when the printed circuit board 100 is assembled in the waste electric equipment, disassembling process is provided before the part elimination process P200. In the disassembling process, the printed circuit board 100 is removed from the waste electric equipment.

In the part elimination process P200, any of the mechanical elimination means for removing the mounted part 70 such as a semiconductor device mechanically at room temperature, the hot elimination means for removing the mounted part 70 by heating up to the melting temperature of solder, or the like may be used as the above part elimination means 2. In the first embodiment, the printed circuit board 100 as the waste printed circuit board 1 is heated up to 200 degrees Celsius, at which the solder is melted, and is scratched by a metallic knife so as to remove the mounted part 70. The metallic knife contacts the surface of the printed circuit board 100 and moves parallel to the above printed circuit board 100.

In the solder elimination process P300, any of the mechanical elimination means for removing the solder 80 mechanically, the hot elimination means for melting the solder 80, or the like may be used as the above solder elimination means 3. In the first embodiment, the surface of the printed circuit board 100 is abraded by an abrasive-grinder of item #320 mounted in a rotary-type grinder. Then, the solder 80 is eliminated by the abrasive-grinder.

In the hot filtration process P400, the printed circuit board 100 as the work piece 1, from which the mounted part 70 and the solder 80 are eliminated by means of the part elimination process P200 and the solder elimination process P300, is heated and force-filtered by the hot filtration equipment 4a shown in FIG. 2. The insulating material 1a made of the resin material is softened by heating, and is filtered through the filter 4a1. Then, only the insulating material 1a is passed through the filter 4a1. The force-filtration is the filtration with heating and pressurizing, and the insulating material 1a is filtered efficiently.

In detail, in the hot filtration process P400, the work piece 1 is heated to 400 degrees Celsius, and is pressurized to 10 MPa in the pressurized room PR of the hot filtration equipment 4a. The mesh size of the filter 4a1, which is a partition to divide the pressurized room PR and the depressurized room DR, is item #50 mesh. Besides, the heating temperature may be not only 400 degrees Celsius but also the temperature, at which the elastic modulus is sufficiently reduced according to the relation between the temperature and the elastic modulus of the insulating material 1a shown in FIG. 6. Moreover, the mesh size may be in the range of the mesh size that passes only the insulating material 1a without blocking the mesh by the insulating material 1a.

The insulating material composing the insulating body base in the printed circuit board according to the prior art is made of thermosetting resin, and the elastic modulus of the thermosetting resin is not reduced even at high temperature. Therefore, it is impossible to separate and to retrieve the insulating material by means of such a simple method.

In the resin forming process P500, the resin products for recycling are re-produced from the insulating material 1a, which is separated and retrieved from the waste printed circuit board 1. The resin forming process P500 is performed by a well-known method. In the metal refining and separating process P600, the metallic materials for recycling are re-produced from the printed metallic material 1b, which is separated and retrieved from the waste printed circuit board 1. The metal refining and separating process P600 is also performed by a well-known method to refine in each metallic category.

Recovery ratio of the insulating material and the printed metallic material by separating and retrieving in the hot filtration process P400 is confirmed as follows. Copper, silver, and tin composing the printed metallic material 1b may be contaminated into the insulating material. The conductive printed circuit 22 is made of copper, and the interlayer bonding material is made of silver and tin. The contamination of copper (Cu), silver (Ag), and tin (Sn) in the insulating material is measured using ion-coupled plasma (i.e., ICP) emission spectral analysis. The measurement of the contamination by the ICP emission spectral analysis is confirmed below 50 ppm, which is the limit of detection. It is confirmed that the insulating material 1a, the printed metallic material 1b, and the interlayer bonding material 50 (Hereinafter, the printed metallic material 1b and the interlayer bonding material 50 are defined as the printed metallic material.) are separated by the separating and retrieving method according to the first embodiment of the present invention, in other words, by the separating and retrieving method to separate the insulating material 1a and the printed metallic material 1b in the hot filtration process P400, wherein the insulating material 1a, the printed metallic material 1b, and the interlayer bonding material 50 compose the printed circuit board 100, i.e., the waste printed circuit board 1. The recovery ratio of the insulating material 1a according to the first embodiment is 90 percent. However, it is easy to increase the recovery ratio of the insulating material by means of simple improvement of the equipment and so on.

In the above first embodiment, the insulating material 1a composing the insulating body base 23 in the printed circuit board 100 is made of the thermoplastic resin or the mixture of thermoplastic resin and inorganic loading material. Therefore, not only the printed metallic material 1b but also the insulating material 1a are separated and retrieved. Then, the separated and retrieved insulating material 1a is formed into a predetermined shape by heating, and is surely recycled.

Furthermore, in the above first embodiment, when the conductive printed circuit films 21 are adhered together and formed into the multi-layer circuit board by heating and pressurizing, the elastic modulus of the insulating material is sufficiently reduced by heating up to nearly the stacking temperature for forming the multi-layer circuit board in the hot filtration process P400. Then, the insulating material 1a is sufficiently softened so as to deform elastically. As a result, only the insulating material passes through the filter by means of the above force-filtration.

In the hot filtration equipment 4a according to the first embodiment, a heater for heating the printed circuit board 100 as the work piece 1 provides the heating means for melting the insulating material lain the work piece 1. Air at positive pressure is introduced into the pressurized room PR, and air at negative pressure is also introduced into the depressurized room DR, wherein the filter 4a1 is sandwiched between the pressurized room PR and the depressurized room DR. The differential pressure between the positive pressure and the negative pressure provides the pressurizing means for pressurizing the insulating material 1a in the work piece 1. The filter 4a1 provides the filtration means for filtering the insulating material 1a in the work piece 1. The casing 4aH provides the hermetically sealing means for hermetically sealing the pressurized room PR, in which the air at positive pressure is introduced, and the depressurized room DP, in which the air at negative pressure is introduced. The casing 4aH also provides the accommodation means for accommodating the pressurized room PR and the depressurized room DP. The filter 4a1 is disposed at the center of the casing 4aH, and divides the pressurized room PR and the depressurized room DP.

SECOND EMBODIMENT

The second embodiment according to the present invention is described as follows. In the case that a component in the second embodiment is the same or similar to a component in the first embodiment, the component in the second embodiment will be provided the same reference numeral in the first embodiment, and is not explained again.

Figure 3:
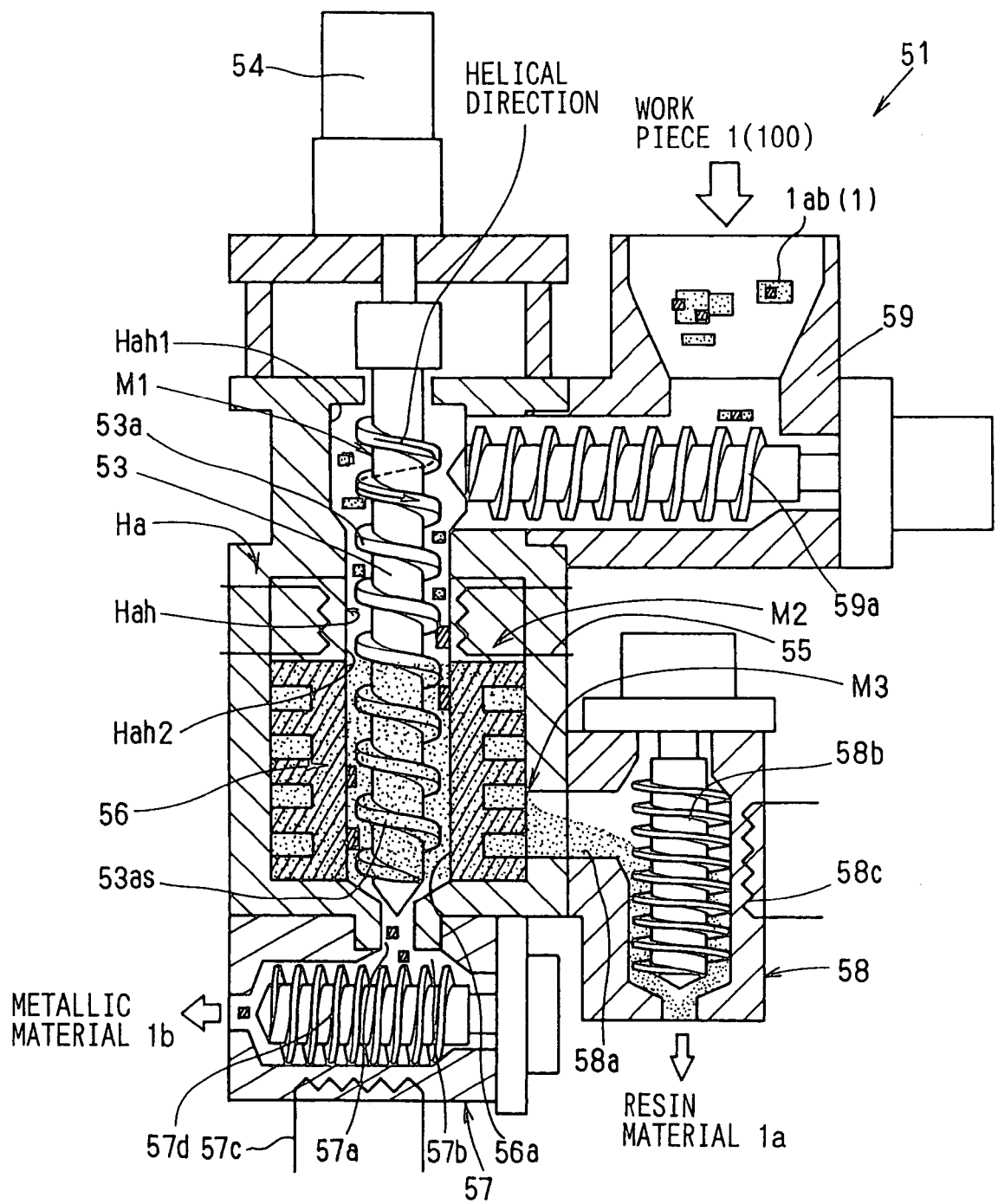
FIG. 3 is a schematic partially cross-sectional view showing hot filtration equipment according to the second embodiment of the present invention.

As shown in FIG. 3, in the second embodiment, equipment 51 is used as a substitute for hot filtration equipment 4a in the first embodiment. The hot filtration equipment 4a provides the pressurizing means by the differential pressure of the air, as is described in the first embodiment. The equipment 51 provides a pressurizing means M1 by rotating a rotational body 53a. FIG. 3 is a partially cross-sectional view showing the equipment 51 according to the second embodiment. This equipment 51 is called the resin-metal separation equipment 51 in the following.

Similar to the hot filtration equipment 4a according to the first embodiment, the resin-metal separation equipment 51 provides a hot filtration means 4 correspondents to hot filtration process P400, which is a part of the entire system to perform a method of recycling a printed circuit board 100 shown in FIG. 1. Other processes in the second embodiment are available to use related equipments, and these related equipments correspondent to the other processes in the second embodiment are skipped to explain.

Figure 9:
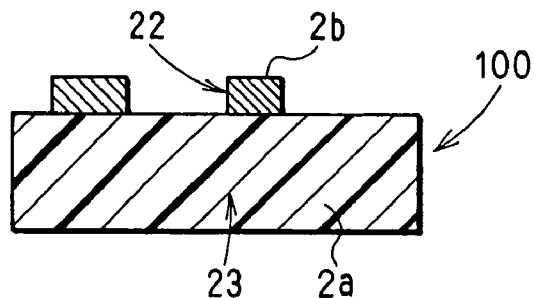
FIG. 9 is a schematic cross-sectional view showing a single layer printed circuit board applied to the method of recycling according to the second embodiment of the present invention

The resin-metal separation equipment 51 in the second embodiment is applied to the printed circuit board 100 as the waste printed circuit board 1. The printed circuit board 100 recycled according to the second embodiment is not only the so-called multi-layer printed circuit board 100 (see FIG. 5), which is formed by stacking the conductive printed circuit films 21 and is described in the first embodiment, but also a single layer printed circuit board and also double layer printed circuit board. As shown in FIG. 9, the single layer printed circuit board is composed of an insulating body base 23, and a conductive printed circuit 22 is formed on one side of the insulating body base 23. The double layer printed circuit board (not shown) is composed of an insulating body base 23, and two conductive printed circuits 22 are formed on both sides of the insulating body base 23. Besides, in general, the single layer printed circuit board may not have a conductive product 51, and the double layer printed circuit board may have the conductive product 51. In the second embodiment, a printed metallic material 1b, or a printed metallic material 1b and an interlayer bonding material 50 in the conductive product 51 are separated and retrieved from the insulating material 1a by heating and force-filtering the waste printed circuit board 1. The printed metallic material 1b or the printed metallic material 1b and the interlayer bonding material 50 in the second embodiment are called metallic material 1b for convenience. Thermoplastic resin or mixture of thermoplastic resin and inorganic loading material, which compose the insulating material in the insulating body base 23, are called resin material 1a for convenience.

As shown in FIG. 3, the resin-metal separation equipment 51 has following functions mainly, which are expressed as main means. The main means are composed of a waste printed circuit board 1, a pressurizing means M1, a heating means M2, and a filtering means M3. The waste printed circuit board 1 is a work piece 1 to be separated to the resin material 1a and the metallic material 1b. The pressurizing means M1 pressurizes the work piece 1. The heating means M2 heats the work piece 1 up to a predetermined temperature so as to soften the work piece 1 at least. The filtering means M3 filters the resin material 1a from the work piece 1, which is maintained at the predetermined temperature by the heating means M2.

The second embodiment is the method for recycling the printed circuit board 100 as the waste printed circuit board 1, which is made of thermoplastic resin. In the above means, the printed circuit board 100 is heated and softened by the heating means M2. Only the resin material 1a passes through a filter in force-filtration equipment of the pressurizing means M1, and it is easy to separate and to retrieve the resin material 1a by the filtering means M3. For example, the waste printed circuit board 1, which is a waste of the printed circuit board 100, is heated by the heating means M2. Then, the waste printed circuit board 1 is heated nearly up to a process temperature for hot-forming the printed circuit board 100 in a primary product process. The resin material 1a in the printed circuit board 100 is melted, and it is easy to separate and to retrieve the melted resin material 1a by the filtering means M3.

Referring to FIG. 3, the architecture and operation of the above means M1, M2, M3 are described in detail as follows.

At first, the pressurizing means M1 is composed of a driving shaft 53, a driving unit 54, and a holder unit Ha. The driving shaft 53 has the above rotational body 53a to transport the waste printed circuit board 1. The driving unit 54 rotates the driving shaft 53. The holder unit Ha accommodates the rotational body 53a. A predetermined pressure is applied to an inner circumference wall Hah of the holder unit Ha, which accommodates the rotational body 53a. The predetermined pressure is generated by transport pressure caused by rotating the rotational body 53a. The waste printed circuit board 1 is transported by the rotational body 53*a*, and is pressurized by the transport pressure of the rotational body 53*a*.

When the predetermined pressure generated by the rotational body 53*a* is sufficiently large, a filtration of the resin material 1*a* is efficiently performed by the force-filtration of pressurizing means. On the other hand, even when the predetermined pressure is comparably small, the filtration of the resin material 1*a* is performed by means of taking enough time for filtering. In other words, the resin material 1*a* is separated and retrieved under any pressure.

The heating means M2 is disposed on the inner circumference wall Hah in the holder unit Ha, and involves a heater 55 to heat the waste printed circuit board 1. The heating means M2 maintains the temperature of all around the inner circumference wall Hah in the holder unit Ha, in which the waste printed circuit board 1 is placed. The waste printed circuit board 1, which is the work piece 1 accommodated inside the inner circumference wall Hah of the holder ha, is easily maintained at the predetermined temperature, at which the printed circuit board 100 is softening at least. Moreover, aggregation of the work piece 1 is generated caused by rotating the rotational body 53*a*. Then, the aggregation may generate a frictional heat by collision of the waste printed circuit boards 1 together. This frictional heat assists the heater 55 for heating the waste printed circuit board 1, and an energy consumption of the heater 55 is reduced.

For example, the heating temperature of the heater 55 in the heating means M2 is controlled so that the waste printed circuit board 1 as the work piece 1, which is a waste of the printed circuit board 100, is maintained at the predetermined temperature, which is nearly the process temperature for hot-forming the printed circuit board 100 in the primary product process. This temperature control enables to form the resin material 1*a* into a melting state, which is disposed inside the inner circumference wall Hah of the holder unit Ha. The holder unit Ha accommodates the rotational body 53*a*, and covers the peripheral surface of the rotational body 53*a*. A filter 56 to be mentioned later is disposed and exposed on the inner circumference wall Hah of the holder unit Ha. Therefore, a circumference wall 56*a* of the filter 56 also composes the same inner circumference wall Hah.

In this second embodiment, the predetermined temperature maintained by the heater 55 is set to nearly the process temperature for hot-forming the printed circuit board 100 in the primary product process. The resin material 1*a* in the waste printed circuit board 1 made of thermoplastic resin is softened so that the resin material 1*a* is separated and retrieved by the filtration means M3.

The filtering means M3 provides the filter 56 to pass the resin material 1*a* only from the waste printed circuit board 1 as the work piece 1. The filter 56 is dispose and exposed on the inner circumference wall Hah of the holder unit Ha. The resin material 1*a* is retrieved in a radial outward direction of the driving shaft 53.

Therefore, the filter 56 passes the resin material 1*a* only (in detail, the melted resin material 1*a*) from the waste printed circuit board 1 with pressurizing, because the filter 56 is disposed and exposed on the inner circumference wall Hah of the holder unit Ha, and the predetermined pressure is applied on the inner circumference wall Hah by the transport pressure of the above pressurizing means M1 (in detail, caused by rotating the rotational body 53*a*).

The filter 56 is made of sintered metal. In general, the sintered metal has porous structure, and the porous structure forms meandering filter passages, because single holes in the porous structure are connected together, and so on. Therefore, the mesh hole of the filter 56, which passes and filters the filtering material through therein, is formed into meandering filter passages, not into straight through holes. Therefore, the filter has meandering mesh holes that pass through the resin material 1*a*. The metallic material 1*b* is prevented to pass through the meandering mesh holes, because even long and thin needle-like metallic material can be caught by the meandering mesh holes.

Besides, the filter 56 may be used to any kind of filter that has mesh holes to pass the resin material 1*a* and not to pass the metallic material 1*b*. For example, that is disk-filter, ceramic-filter, urethane foaming filter, or the like. The disk-filter has a multi-layer structure stacking a stainless filter. The filter 56 made of the sintered metal is provided at low cost, compared with the disk-filter that is assembled in complicated structure.

In the second embodiment, the filter 56 is made of the sintered metal that is formed by stainless (SUS) as a metallic material. The dimension of the mesh hole is 50 microns. When the dimension of the mesh hole is in the range of 25-200 microns, the resin material 1*a* can be separated from the metallic material 1*b*. When the dimension of the mesh hole reduces, the life of the filter 56 is shortened. When the filter 56 is made of the sintered metal, the dimension of the mesh hole can be enlarged about 200 microns by substitution of stainless (SUS) to copper (Cu) as a sintered metal.

When the waste printed circuit board 1 is a multi-layer printed circuit board, it is preferred that the dimension of the mesh hole is below 100 microns, because the conductive product 51 made of the interlayer bonding material 50 is about 100-200 microns in average size.

In the second embodiment, even when the comparably high pressure is applied to the circumference wall 56*a* of the filter 56, the filter 56 is guaranteed the quality in its mechanical strength, which is due to the structural strength of the sintered metal. Therefore, the filtering area, which extends over the circumference wall 56*a*, is comparably wide even in comparably high pressure. A predetermined amount of the work piece 1 (in detail, the waste printed circuit board 1) is processed in a batch, without dividing the work piece 1. As a result, the productivity for separating the resin material 1*a* and the metallic material 1*b* promotes.

When the filter 56 is made of the sintered metal, as mentioned above, the dimension of the mesh holes is defined by the metallic material comprising the filter 56. Therefore, the dimension of the mesh holes is decided in substantially high accuracy.

In the printed circuit board 100, which is recycled as the waste printed circuit board 1, the insulating material 1*a* composing the insulating body base 23 may be used to any kind of insulating material that is made of thermoplastic resin only or mixture of thermoplastic resin and inorganic loading material, such as resin film. For example, those are polyether ether ketone (i.e., PEEK) resin, polyether imide (i.e., PEI) resin, mixture of PEEK resin and PEI resin, thermoplastic polyimide (i.e., thermoplastic PI) resin, polyphenylene sulfide (i.e., PPS) resin, and liquid crystal polymer (i.e., LCP). Therefore, the resin material 1*a*, which is separated and retrieved by the resin-metal separation equipment 51, is a kind of thermoplastic resin even when any kind of the above resin composes the insulating material 1*a*. Accordingly, the retrieved resin material 1*a* has the same composition, and is expected to have the equivalent characteristics to the before-retrieving resin material 1*a*, i.e., the insulating material 1*a*.

A retrieving outlet 57a is disposed under a top end 53as of the rotational body 53a. The metallic material 1b, which is remained by filtering through the filter 56, is collected into the retrieving outlet 57a, and retrieved from the retrieving outlet 57a.

As shown in FIG. 3, the rotational body 53a is possible to slide up and down. In filtering process, the top end 53as of the rotational body 53a slides downward and contacts the retrieving outlet 57a. Then, the retrieving outlet 57a is closed by the top end 53as of the rotational body 53a. Therefore, in filtering process, the resin material 1a is not leaked from the retrieving outlet 57a, and is pressurized by the transport pressure caused by rotating the rotational body 53a. On the other hand, after filtering process, the top end 53as slides upward. Then, a predetermined clearance between the top end 53as and the retrieving outlet 57a is provided. As the rotational body 53a is rotated with having the predetermined clearance, the metallic material 1b, which does not pass though the filter 56, extrudes into the retrieving outlet 37 through the above clearance.

According to the second embodiment, the printed circuit board 100 as the waste printed circuit board 1, of which the resin material 1a is made of thermoplastic resin, is recycled, and the resin material 1a is separated and retrieved efficiently.

In the second embodiment, it is preferable to provide following character.

The rotational body 53a in the pressurizing means M1 has a helical body structure, and the driving unit 54 rotates the rotational body 53a in a helical direction (i.e., a direction of an arrow shown in the rotational body 53a in FIG. 3) by the driving shaft 53. The filtering means M3 (in detail, the filter 56) is disposed on the inner circumference wall Hah at the side of the top end 53as, which is drove in the helical direction of the rotational body 53a. The helical rotational body 53a rotates in the helical direction, and a rotational force of the helical rotational body 53a generates a centrifugal force and a feeding force. The centrifugal force is a radial component of the rotational force along with a helical rotational direction. The feeding force, i.e., the pressurizing force by transport pressure, is an axial component of the rotational force along with an axial direction.

The waste printed circuit board 1 is fed and pressurized by the transport pressure caused by rotating the rotational body 53a. Therefore, the more the printed circuit board 1 feeds to the top end 53as of the rotational body 53a, which is drove in the helical direction, the more the printed circuit board is pressurized.

The helical shape of the rotational body 53a has a lead angle (i.e., screw lead angle) of non-equal pitch. The more it goes to the helical direction, i.e., to the top end 53as, the more the screw lead angle is reduced. This screw lead angle of non-equal pitch increases the transport pressure, which is the axial component of the rotational force, compared with the radial component of the rotational force. Then, the predetermined pressure can be generated. Therefore, even when the resin material 1a, which is at least softened by heating, shows a high viscosity, the resin material 1a can be pressurized up to the predetermined pressure by the pressurizing force of the transport pressure along with the axial direction within comparably low rotating speed of the rotational body 53a. It is not necessary to increase the rotating speed of the rotational body 53a so as to increase the pressurizing force caused by the centrifugal force.

The filtering performance prevents from reducing because the feeding force along with the axial direction caused by rotating the rotational body 53a eliminates the metallic material 1b, which is accumulated on the filtering means M3 (in detail, the filter 56).

As a result, it is easy to filter the resin material 1a by the filtering means M3, and the resin material 1a is filtered efficiently.

The driving shaft 53 of the rotational body 53a is preferable to dispose in the vertical direction. When the filter 56 passes the resin material 1a only from the mixture of the resin material 1a and the metallic material 1b, the metallic material 1b, which is not passed through the filter 56, precipitates vertically downward (in detail, downward of the filter 56, which is disposed on the inner circumference wall Hah). Then, the resin material 1a is pressed on the inner circumference wall Hah by the centrifugal force. Accordingly, the resin material 1a is separated and retrieved by the filter 56, which is exposed on the inner circumference wall Hah. The metallic material 1b is precipitated downward without plugging the filter 56.

Moreover, in the second embodiment, it is preferable to provide following character.

The space 57b to reserve the metallic material 1b is disposed in the retrieving outlet 57a, in which the residual metallic material 1b by the filtration of the filter 56 is collected. Accordingly, a metal retrieving unit 57 is located on the other end of the inner circumference wall Hah of the holder unit Ha, opposite to the driving unit 54. The metallic material 1b is collected into the metal retrieving unit 57 through the retrieving outlet 57a, and the metal retrieving unit 57 reserves the metallic material 1b. Therefore, the metallic material 1b is deposited and filled the space 57b in accordance with retrieving the resin material 1a by the filtering means M3 from the metallic material 1b and the resin material 1a, which compose the waste printed circuit board 1 transferred by the rotational body 53a.

Besides, it is preferred that a heater 57c and a screw driving unit 57d are disposed in the metal retrieving unit 57. The heater 57c and the screw driving unit 57d are used in the case that the metallic material 1b is filled in the space 57b (more precisely, most part of the mixture of the resin material 1a and the metallic material 1b filled in the space 57b is the metallic material 1b). By means of the heater 57c and the screw driving unit 57d, the metallic material 1b is not adhered together with the resin material 1a, which is contaminated into the metallic material 1b, and is extruded by the screw driving unit 57d.

Referring to FIG. 3, a loading unit 59 can be provided as a preparing means before the pressurizing means M1 described in the above second embodiment. The loading unit 59 carries the work piece 1 by screw. A screw-type loader 59a shown in FIG. 3 (i.e., screw unit 59a) rotates so as to carry the work piece 1. The work piece 1 (in detail, the waste printed circuit board 1 or divided board pieces lab that is cut the waste printed circuit board 1 into pieces in predetermined size) is controllable supplied to the pressurizing means M1 according to a pitch of rotating the screw unit 59a. In other words, supply of the work piece 1 to the pressurizing means M1 is regulated by controlling the rotational speed of the screw unit 59a.

Moreover, a resin-retrieving unit 58 can be provided next to the filtration means M3, which is described in the above second embodiment. The resin-retrieving unit 58 involves a leading port 58a, which leads to the filter 56, and reserves the resin material 1a temporary, wherein the resin material 1a is separated and retrieved through the filter 56. It is preferred that a screw-type loader 58b (i.e., a screw unit 58b) and a heater 58c are provided in the resin-retrieving unit 58.

The heater 58c heats the resin material 1a, which is aggregated by the screw unit 58b. The screw unit 58b and the heater 58c prevent failure. For example, the resin material 1a, which is separated and retrieved, is not cooled and solidified by the screw unit 58b and the heater 58c so that the resin-metal separation equipment 51 is not stacked.

Besides, the filter 56 described in the above second embodiment, may be used to a so-called pre-coat filter. Preliminary, a mesh hole is provided slightly large. As the resin-metal separation equipment 51 operates, the metallic material 1b accumulates on the circumference wall 56a of the filter 56. Then, the mesh hole of the filter 56 becomes small and get into the predetermined mesh hole. This pre-coat filter promotes the life of the filter 56.

In the pressurizing means M1 described in the above second embodiment, the rotational body 53a, especially a clearance in the radial direction between the helical rotational body 53a and the circumference wall 56a of the filter 56 may become small. This small clearance provides to scratch the metallic material 1b, which is accumulated on the circumference wall 56a. Then, the resin-metal separation equipment 51, especially, the filter 56 can be self-reactivated, and the life of the filter 56 promotes to be long.

THIRD EMBODIMENT

Figure 7A:
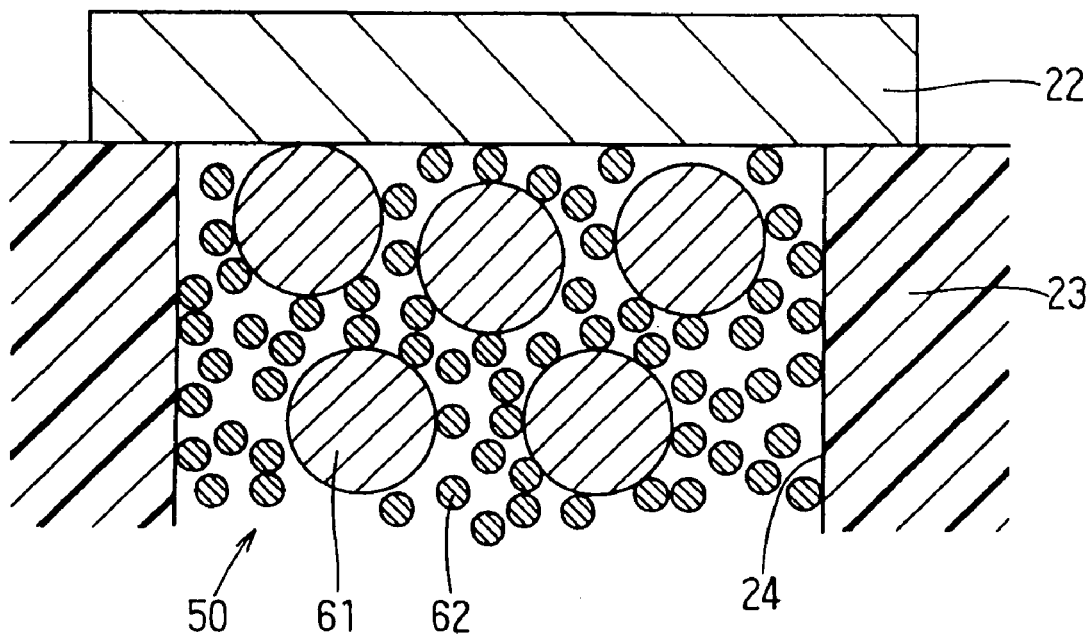
FIG. 7(a) is a schematic cross-sectional view showing a state of material in the via hole after filling a conductive bonding paste.
Figure 7B:
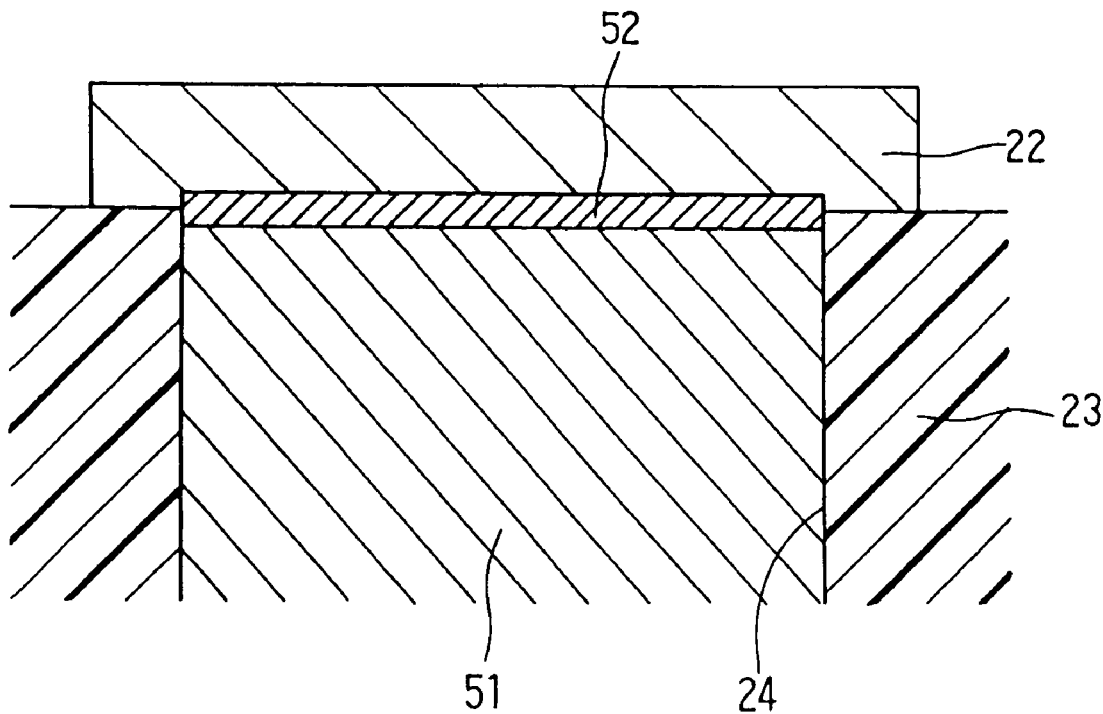
FIG. 7(b) is a schematic cross-sectional view showing a state of material in the via hole after interlayer bonding.

A waste printed circuit board 1 according to the third embodiment is composed of an insulating body base 23, which is made of thermoplastic rein only or mixture of thermoplastic resin and inorganic loading material as described in the first embodiment. In addition, it is preferred that the waste printed circuit board 1 according to the third embodiment has following characters and is made by means of following method shown in FIG. 7. FIG. 7 are schematic partially enlarged views showing states of material in a via-hole 24 of a printed circuit board 100 applied to a method of recycling according to the third embodiment. FIG. 7A is a schematic cross-sectional view showing a state of material in the-via hole 24 after filling a conductive bonding paste 50 as an interlayer bonding material 50. FIG. 7B is a schematic cross-sectional view showing a state of material in the via-hole 24 after interlayer bonding with a conductive product 51 connecting conductive printed circuits 22 together.

As shown in FIG. 7, a constitutional characteristic of the printed circuit board 100 is an electric connection between the conductive printed circuits 22 by the conductive product 51, which is integrated in the via-hole 24 formed on a resin film 23 as an insulating body base. The conductive product 51 is made of metallic material 1b only, mixture of metallic material 1b and thermoplastic resin material 1a composing the resin film 23, or mixture of metallic material 1b, thermoplastic resin material 1a, and inorganic loading material.

Therefore, when the resin material 1a is separated and retrieved from the waste printed circuit board 1, the conductive product 51 is contaminated as the interlayer bonding material 50 into the insulating material 1a. The composition of the contamination of the conductive product 51 is the same as the composition of the insulating material 1a, which composes the resin film 23. Therefore, the retrieved insulating material 1a is not reduced in its purity. As a result, it is expected that the retrieved insulating material 1a may show the equivalent characteristics to the before-retrieving insulating material.

As shown in FIGS. 7A and 7B, the interlayer bonding material 50, i.e., a conductive bonding paste, which composes the conductive product 51, is composed of first metallic particles 61 and second metallic particles 62. The first metallic particles 61 can be formed into an alloy with the metallic material 1b, which composes the conductive printed circuit 22. The second metallic particles 62 can be formed into an alloy with the metal, which composes the first particles 61. For example, in an interlayer bonding process, the first metallic particles 61 and the second metallic particles 62 are sintered and formed into the integrated conductive product 51 by heating and pressurizing Specifically, the conductive bonding paste 50, i.e., the interlayer bonding material, is made of tin (Sn) composing the first metallic particles 61 and silver (Ag) composing the second metallic particles 62. Besides, FIG. 7A shows the state of the conductive bonding paste 50, which is filled and dried in the via-hole 24 before heating by vacuum hot press equipment (not shown). FIG. 7B shows the state of the conductive bonding paste 50 after sintered by the vacuum hot press equipment.

At first, as shown in FIG. 7A, the conductive bonding paste 50 is the mixture of the tin particles 61 and the silver particles 62. When the conductive bonding paste 50 is heated up to 240-350 degrees Celsius, the tin particles 61 is melted and adhered so as to cover the surface of the silver particles 62, because the melting point of the silver is 961 degrees Celsius, and the melting point of the tin particles is 232 degrees Celsius. When the conductive bonding paste 50 is continued to heat at 961 degrees Celsius, tin atom is diffused into the silver particles 62 from the surface. Then the alloy of silver and tin (melting point is 480 degrees Celsius) is formed. In this case, the conductive bonding paste 50 is pressurized at 2-10 MPa. Therefore, as shown in FIG. 7B, the conductive product 51 in the via-hole is formed into the integrated and sintered alloy in accordance with the alloying of tin and silver.

When the conductive product 51 is formed in the via-hole, the conductive product 51 is adhered to the bottom surface of the conductive printed circuit 22 in the via-hole 24, because the conductive product 51 is pressurized. Therefore, the tin component in the conductive product 51 and the copper component in the copper foil of the conductive printed circuit 22 are mutually diffused together in solid phase. Then, a solid diffusion layer 52 is formed at an interface between the conductive printed circuit 22 and the conductive product 51.

Another interface between the conductive printed circuit 22 and the conductive product 51 is also provided on the lower side of the via-hole 24 not shown in FIG. 7, and the solid diffusion layer 52 of the tin component in the conductive product 51 and the copper component in the copper foil of the conductive printed circuit 22 is also formed. Therefore, the conductive printed circuits 22, which are disposed on the upper and lower sides of the via-hole 24, are electrically and reliably connected together by the solid diffusion layer 52 and the integrated conductive product 51, that is not a contact connection. This connection promotes the reliability of the interlayer bonding.

As a result, the above connection with the conductive product 51 promotes the reliability of the interlayer bonding. Moreover, when the conductive product 51 is heated up to 400 degrees Celsius in hot filtration process P400 for separating and retrieving, the conductive product 51 is maintained in the solid phase surely, because the conductive product 51 is made of the alloy of tin and silver (melting point of the alloy is 480 degrees Celsius). Therefore, in the hot filtration process P400, the insulating material 1a and the printed metallic material 1b (the printed metallic material 1b also involves the interlayer bonding material) are separated and retrieved surely.

Besides, in this interlayer bonding process, the conductive printed circuit 22 is formed on the surface of the resin film 23, which composes the insulating body base 23, so that the resin film 23 forms the conductive printed circuit film 21. Then, the conductive printed circuit films 21 are stacked and adhered together by heating and pressurizing (i.e., formed into the multi-layer printed circuit board).

FOURTH EMBODIMENT

Figure 8:
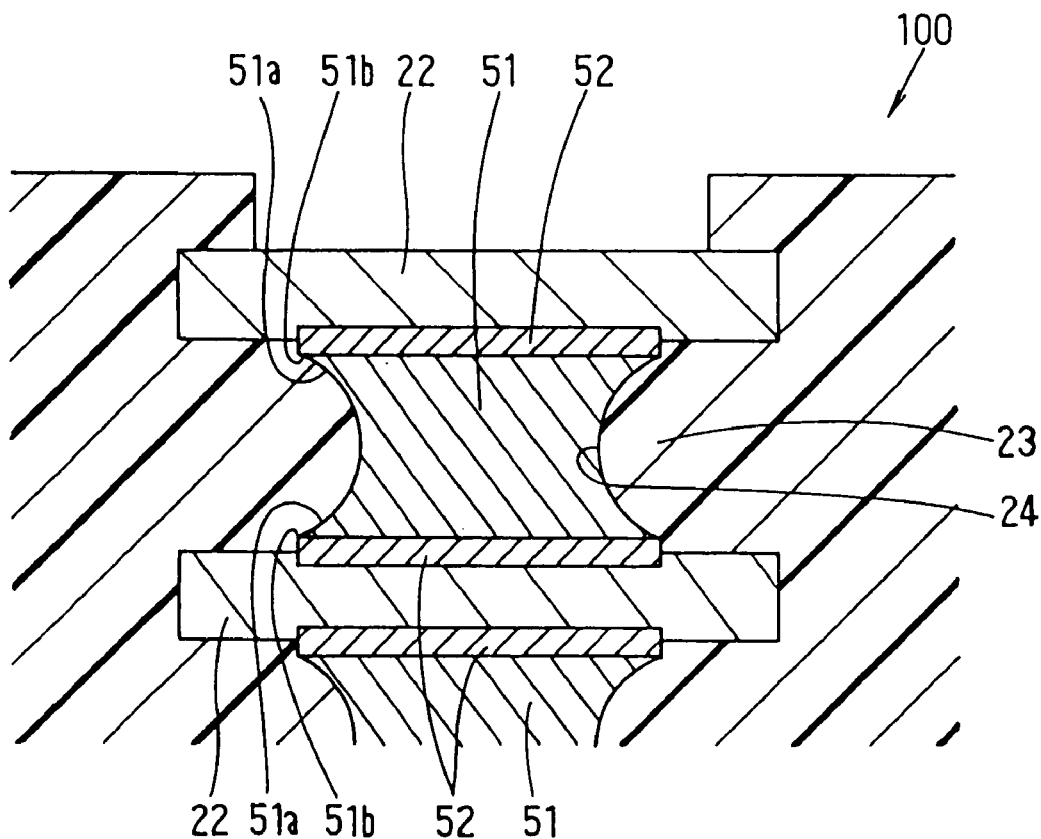
FIG. 8 is a schematic cross-sectional view showing a shape of a conductive product after interlayer bonding in a printed circuit board applied to a method of recycling according to the fourth embodiment of the present invention.

A waste printed circuit board 1 according to the fourth embodiment is preferable to use a printed circuit board 100 having a following constitution. When a conductive product 51 described in the third embodiment is formed, the conductive product 51 is extruded and formed into an arch-like structure in via-hole 24 shown in FIG. 8 under the normal hydrostatic pressure applied to a resin film 23 composing an insulating body base 23. FIG. 8 is a schematic partially enlarged view showing a shape of the conductive product 51 in a printed circuit board 100 applied to a method of recycling according to the forth embodiment after interlayer bonding.

In the heating and pressurizing process by the vacuum hot press equipment described in the third embodiment, the resin film 23 is also heated and pressurized by the vacuum hot press equipment. Therefore, the resin film 23 is deformed along with the expansion direction of the film. The resin film 23, which is disposed around the via-hole 24, is deformed so as to extrude into the via-hole 24. In this case, the elastic modulus of the resin film 23 is reduced to about 5-40 MPa. When the resin film 23, of which the elastic modulus is reduced, is pressurized, a substantially homogeneous pressure (i.e., a so-called hydrostatic pressure) is generated in the resin film 23 composing the insulating body base 23.

When the resin film 23 is continued to pressurize under the substantially homogeneous pressure, the resin film 23 around the via-hole 24 is deformed so as to extrude into the via-hole 24. Then, the extruded volume of the resin film 23 into the center portion of the via-hole 24 (i.e., the portion in the middle of the center axis of the via-hole 24) is larger than that into the edge portion of the via-hole (i.e., the portion at the both ends of the center axis of the via-hole 24), wherein the edge portion of the via-hole 24 is contact with the conductive printed circuit 22.

The inner wall of the via-hole 24 has a substantially cylindrical shape before hot pressing. However, as shown in FIG. 8, a cross-sectional profile of the inner wall of the via-hole 24 along with the center axis of the via-hole 24 has an arc-like shape after hot pressing, because the resin film 23 is extruded into the via-hole 24 as mentioned above. Besides, the elastic modulus of the resin film 23 is in the range of 1-1000 MPa in hot pressing process.

The volume (i.e., apparent volume) of the conductive product 51 is reduced in accordance with sintering. Therefore, a cross-sectional profile of the inner wall of the via-hole 24, which is filled with the conductive product 51, is formed into the arc-like shape along with the center axis of the via-hole 24.

When the printed circuit board 100 is applied to a deformation stress, for example, bending stress and the like, it is also difficult to concentrate the deformation stress in the other portion of a contact area 51b in the conductive product 51, compared with the cylindrical via-hole according to the related art, because the cross-sectional profile of the inner wall of the via-hole 24, which is filled with the conductive product 51, is formed into the arc-like shape along with the center axis of the via-hole 24. As a result, the reliability of the interlayer bonding is promoted.

In a primary product process of the printed circuit board 100, it is constituted that the elastic modulus of the insulating body base 23 (in detail, the insulating body base made of thermoplastic resin) is in the range of 1-1000 MPa at the heating temperature in the hot pressing process. As a result, the cross-sectional profile of the inner wall of the via-hole 24, which is filled with the conductive product, is formed into the arc-like shape 51 along with the center axis of the via hole 24, and then the reliability of the interlayer bonding is promoted. Moreover, in hot filtration process P400 for separating and retrieving, the waste printed circuit board 1 is heated up to the predetermined temperature, which is near the process temperature for forming the printed circuit board 100 by hot pressing in a primary product process (or in the case of the multi-layer printed circuit board, the stacking temperature for stacking the multi-layer printed circuit board in a primary product process), it is easy operation to separate and to retrieve by passing through a filter 4a1 in hot filtration equipment 4a because the elastic modulus of the resin material 1a is sufficiently reduced.

FIFTH EMBODIMENT

Figure 4:
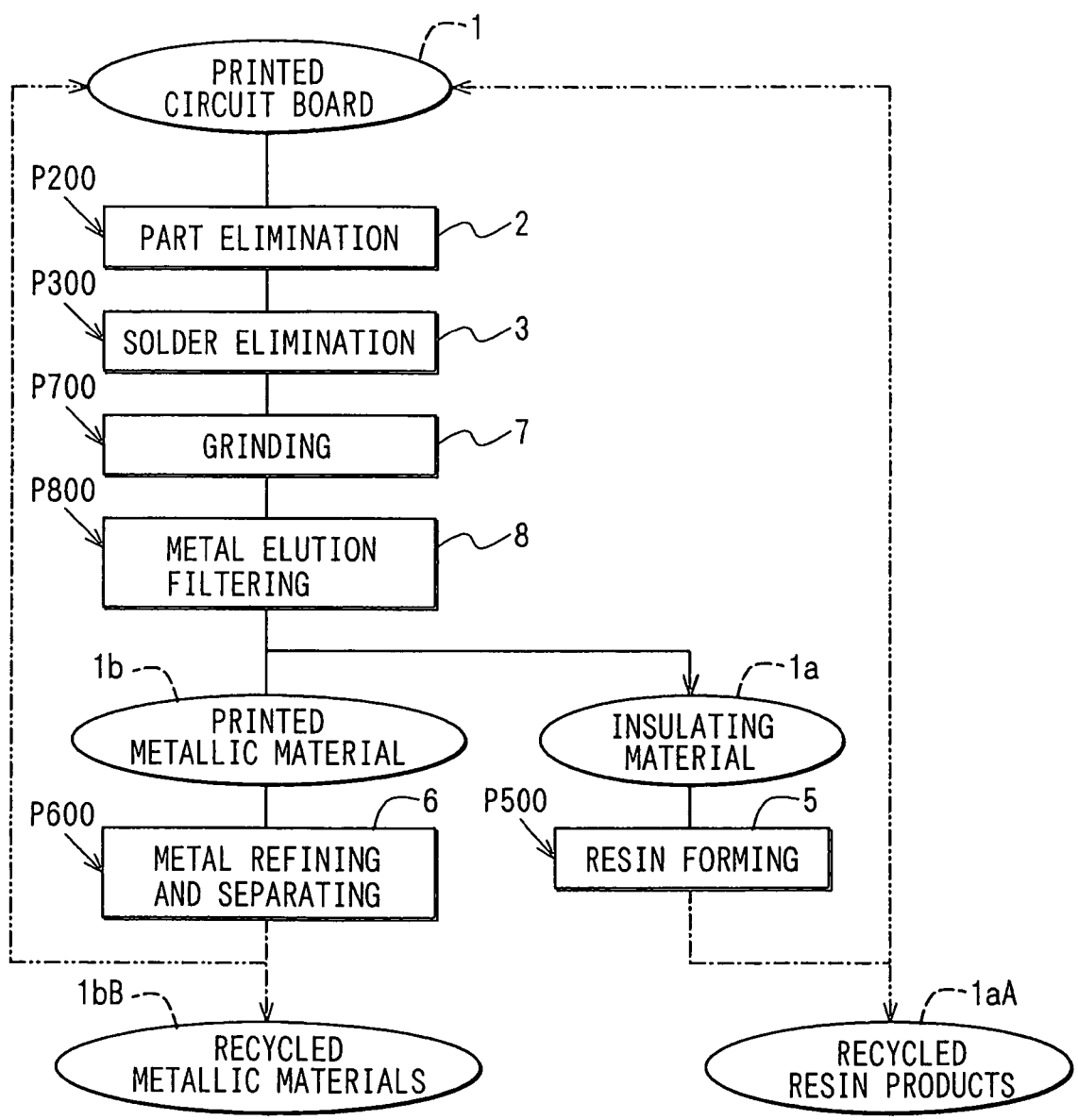
FIG. 4 is a schematic block diagram showing a method of recycling a printed circuit board according to the fifth embodiment of the present invention.

The fifth embodiment can be applied to a method for recycling a printed circuit board shown in FIG. 4. FIG. 4 is a schematic block diagram showing an entire process of recycling the printed circuit board according to the fifth embodiment. FIG. 4 is also a schematic block diagram showing the recycling system to perform the recycling of the printed circuit board according to the fifth embodiment. A difference between the fifth embodiment and the first embodiment is described as follows.

In grinding process P700, a printed circuit board 100, which is eliminated a mounted part 70 and solder 80 in part elimination process P200 and solder elimination process P300 respectively, is ground into powder. Then, the printed circuit board 100 as a work piece 1 becomes a mixed powder of an insulating material 1a and a printed metallic material 1b. Besides, grinding means 7 may be used to any kind of means that grinds a resin material 1a and a metallic material 1b, which compose the printed circuit board 100. In the following fifth embodiment, the printed circuit board 100 is cut into pieces about 5 cm square by a rotary wheel type cutting machine. Then, the pieces are ground into the powder by a cutter mill for grinding by rotating a rotational cutter.

When the particle diameter of the powder in the grinding process P700 is smaller than a dimension of thickness of a resin film 23 composing the printed circuit board 100 for recycling, a part of a printed metallic material 1b, which is sandwiched in a multi-layer printed circuit board, is surely exposed on the surface of the powder. Therefore, when the printed metallic material 1b is, for example, eluted into an eluant, a processing time for eluting the printed metallic material 1b is shortened by the above grinding process P700. As a result, the grinding process P700 promotes the efficiency of separating and retrieving the printed metallic material 1b.

On the other hand, when the particle diameter is comparably large, the printed metallic material 1b can be eluted by means of taking enough time to elute the printed metallic material 1*b*. In other words, the printed metallic material 1*b* can be separated and retrieved in any particle diameter.

In the fifth embodiment, the printed circuit board 100 is shattered into the particles, of which the average particle diameter is about 100 micron. The cutter mill has a rotational cutter, which is made of metallic cutter with titanium (Ti) coating, and rotates the rotational cutter at a rotational speed of 3000 rotations per minute (rpm/min). The cutter mill grinds into the powder during 15 minutes.

In metal elution filtering process P800, the powder ground in the above grinding process P700 is dipped in the eluant, and the printed metallic material 1*b* is eluted. In the printed circuit board 100, which is recycled as the waste printed circuit board 1 according to the fifth embodiment, for example, the printed metallic material 1*b* composing the conductive printed circuit 22 is made of copper (Cu) foil, and the interlayer bonding material 50 is made of tin (Sn) and silver (Ag). The eluant is prepared a mixture of hydrochloric acid, nitric acid, and water so that the eluant elutes both the printed metallic material 1*b* and the interlayer bonding material 50 simultaneously. The mixing ratio of hydrochloric acid, nitric acid, and water is 1:1:2. The above ground powder is dipped in the eluant during 10 minutes, and both the printed metallic material 1*b* and the interlayer bonding material 50 are eluted. After that, the eluant is filtered, and the insulating material 1*a* is separated and retrieved. Further, the separated insulating material 1*a* is water-washed and dried.

This process performs to separate and retrieve the insulating material 1*a* and the printed metallic material 1*b* completely and easily.

In the fifth embodiment, the insulating body base 23 of the printed circuit board 100, which is recycled as the waste printed circuit board 1, is made of thermoplastic resin only or mixture of thermoplastic resin and inorganic loading material. It is preferred that an elastic modulus of the insulating body base 23 made of thermoplastic resin is in the range of 1-1000 MPa at the heating temperature, which is near the process temperature for forming the printed circuit board 100 by hot pressing in a primary product process. The elastic modulus of the resin material 1*a* is sufficiently reduced so that the insulating material 1*a*, which is separated and filtered in the metal elution filtering process P800, is easily formed into a predetermined shape in resin forming process P500.

The resin film 23 composing the insulating body base 23 in the printed circuit board 100, which is recycled as the waste printed circuit board 1, has a via-hole 24. The conductive printed circuits 22 are electrically connected together by a conductive product 51 integrated in the via-hole 24. It is preferred that the conductive product 51 is made of metallic material 1*b* only, mixture of metallic material 1*b* and thermoplastic resin material 1*a*, which composes the resin film 23, or mixture of metallic material 1*b*, thermoplastic resin material 1*a*, and inorganic loading material. Even if the conductive product 51 is contaminated into the insulating material 1*a*, which is separated and retrieved in the metal elution filtering process P800, the retrieved insulating material 1*a* is not reduced in its purity, because the conductive product 51 has the same composition as the insulating material 1*a*, which composes the resin film 23. Accordingly, the retrieved resin material 1*a* is not reduced in its purity, and is expected to have the equivalent characteristics to the before-retrieving resin material.

As is generally known, the printed metallic material 1*b* and the interlayer bonding material 50, which are eluted in the metal elution filtering process P800, can be retrieved and recycled as the metal by means of a well-known method of processing waste acid-liquid according to a related art. In detail, for example, the metal is retrieved as a solid phase metal by heating and melting, or the metal is separated as an individual metal by electrolysis.

The printed metallic material 1*b*, which is separated and retrieved by the waste acid-liquid processing method or the like, is refined in each metallic category in the metal refining and separating process P600.

The insulating material, which is separated and retrieved, is examined and analyzed using ion-coupled plasma (i.e., ICP) emission spectral analysis. The contamination of the printed metallic material 1*b* and the interlayer bonding material 50, which are contaminated into the insulating material 1*a*, is analyzed by the ICP emission spectral analysis and confirmed below 50 ppm, which is the limit of detection. Therefore, the contamination is sufficiently small not to detect, or the contamination does not exist.

In the above fifth embodiment, the insulating material 1*a* and the printed metallic material 1*b* are separated and retrieved in the hot filtration process P400 and the metal elution filtering process P800 respectively, and are recycled in the resin forming process P500 and the metal refining and separating process P600 respectively. The insulating material 1*a* and the printed metallic material 1*b* are recycled as a material of recycled printed circuit board (referring to a recycling flow chart showing a dashed line in FIGS. 1 and 4). The insulating material 1*a* and the printed metallic material 1*b* are also recycled as other materials (in detail, those are recycled resin products 1*a*A and recycled metallic materials 1*b*B respectively, referring to a recycling flow chart showing a solid line in FIGS. 1 and 4).

Moreover, recycled resin films are made of the recycled insulating material 1*a*, which is separated and retrieved, by reheating and re-pressurizing. These recycled resin films are tested for insulating character. The result of the test shows that the recycled resin films have the same insulating character as the initial insulating character of the resin film 23. It is confirmed that the method of recycling the printed circuit board by the present invention makes up in business and is reasonable to utilize as vocation.

INDUSTRIAL APPLICABILITY

As a result, method and apparatus of recycling a printed circuit board by the present invention is also available for recycling an insulating material composing the printed circuit board. Moreover, the insulating material, which is separated and retrieved, has almost the same composition as that of the printed circuit board before separating and retrieving. Therefore, for example, the method and apparatus of recycling by the present invention is available for recycling a waste printed circuit board as a recycled insulating material of a printed circuit board.

The invention claimed is:

1. An apparatus for separating resin and metal to separate a resin material composing an insulating material and a metallic material so as to separate and to retrieve the insulating material composing a printed circuit board and the metallic material including a printed metallic material and also composing the printed circuit board from a waste printed circuit board, which is used in waste electric equipment or a waste produced in a process of manufacturing electric equipment, comprising;

a pressurizing means for pressurizing the waste printed circuit board, a heating means for heating up the waste printed circuit board to a predetermined temperature at which the waste printed circuit board is at least softened, and a filtering means for filtering the resin material from the waste printed circuit board that is maintained at the predetermined temperature by means of the heating means, wherein:

the insulating material is made of either thermoplastic resin only or a mixture of thermoplastic resin and an inorganic loading material, the filtering means filters the insulating material only, the filtering means is made of a sintered metal, and the filtering means includes a filter, which passes only the resin material from the waste printed circuit board, the pressurizing means includes a driving shaft, which has a rotational body for transporting the waste printed circuit board, a driving unit, which rotates the driving shaft, and a holder unit, which accommodates the rotational body, a predetermined pressure caused by a rotational force of the rotational body is applied to an inner circumference wall of the holder unit, the driving shaft of the rotational body is disposed in a vertical direction, the filtering means is disposed and exposed on the inner circumference wall of the holder unit, so that the resin material is retrieved in the radial outward direction of a driving shaft, and the rotational body rotates within the inner circumferential wall of the holder unit, which is provided by a circumferential wall of the filtering means.

2. An apparatus for separating resin and metal according to claim 1, wherein the holder unit provides a space, which is located on the opposite side of the driving unit and capable of reserving the metallic material.

* * * * *